(12) United States Patent
Yoshida et al.

(10) Patent No.: US 9,961,810 B2
(45) Date of Patent: May 1, 2018

(54) DISPLAY DEVICE

(71) Applicant: DENSO CORPORATION, Kariya, Aichi-pref. (JP)

(72) Inventors: Makoto Yoshida, Kariya (JP); Shusaku Takama, Kariya (JP)

(73) Assignee: DENSO CORPORATION, Kariya, Aichi-pref. (JP)

(*) Notice: Subject to any disclaimer, the term of this patent is extended or adjusted under 35 U.S.C. 154(b) by 0 days. days.

(21) Appl. No.: 14/895,002

(22) PCT Filed: May 29, 2014

(86) PCT No.: PCT/JP2014/002849
§ 371 (c)(1),
(2) Date: Dec. 1, 2015

(87) PCT Pub. No.: WO2014/196173
PCT Pub. Date: Dec. 11, 2014

(65) Prior Publication Data
US 2016/0120076 A1    Apr. 28, 2016

(30) Foreign Application Priority Data

Jun. 7, 2013 (JP) .................................. 2013-120820

(51) Int. Cl.
*H05K 9/00* (2006.01)
*G02F 1/1333* (2006.01)

(52) U.S. Cl.
CPC ..... *H05K 9/0054* (2013.01); *G02F 1/133308* (2013.01); *H05K 9/0049* (2013.01);
(Continued)

(58) Field of Classification Search
CPC ...... H05K 9/00; H05K 9/0054; H05K 9/0049; G09F 9/00; G02F 2001/133328;
(Continued)

(56) References Cited

U.S. PATENT DOCUMENTS 5,805,251 A * 9/1998 Ozawa .............. G02F 1/133308
174/36
6,560,124 B1 * 5/2003 Irie .......................... H05K 5/02
174/377
(Continued)

FOREIGN PATENT DOCUMENTS

JP     H03105997 A    5/1991
JP     H11298182 A    10/1999
(Continued)

OTHER PUBLICATIONS

International Search Report and Written Opinion (in Japanese with English Translation) for PCT/JP2014/002849, dated Aug. 12, 2014; ISA/JP.

*Primary Examiner* — Dimary Lopez Cruz
*Assistant Examiner* — Abhishek Rathod
(74) *Attorney, Agent, or Firm* — Harness, Dickey & Pierce, P.L.C.

(57) ABSTRACT

A display device includes a display panel unit having a noise generating source, and a metal frame to which the display panel unit is attached. The display panel unit is fixed to an attachment part which is provided at the frame. The frame includes a contact part that brings the display panel unit into contact with the frame, in addition to the attachment part.

7 Claims, 6 Drawing Sheets

(52) U.S. Cl.
CPC ............ *G02F 2001/133314* (2013.01); *G02F 2001/133334* (2013.01)

(58) Field of Classification Search
CPC ... G02F 1/133308; G02F 2001/133314; G02F 2001/133334
See application file for complete search history.

(56) References Cited

U.S. PATENT DOCUMENTS

| | | | | |
|---|---|---|---|---|
| 6,728,555 | B1* | 4/2004 | Pirila | H04M 1/0202 361/816 |
| 2004/0183959 | A1* | 9/2004 | Ishida | G02F 1/13452 349/58 |
| 2005/0024573 | A1* | 2/2005 | Suzuki | G02F 1/133308 349/149 |
| 2005/0237275 | A1 | 10/2005 | Inoue et al. | |
| 2005/0258726 | A1* | 11/2005 | Bang | H05K 5/02 313/49 |
| 2005/0264982 | A1* | 12/2005 | Kim | H05K 7/142 361/679.21 |
| 2006/0181210 | A1* | 8/2006 | Ahn | H01J 11/10 313/582 |
| 2007/0002535 | A1 | 1/2007 | Kim | |
| 2008/0055833 | A1* | 3/2008 | Hori | H01J 11/10 361/679.01 |
| 2008/0100215 | A1* | 5/2008 | Cho | H01J 11/10 313/582 |
| 2008/0266485 | A1* | 10/2008 | Shen | G02F 1/133308 349/59 |
| 2011/0080697 | A1* | 4/2011 | Ishikawa | H05K 5/0247 361/679.01 |
| 2013/0093961 | A1* | 4/2013 | Yokawa | G02F 1/1306 348/725 |

FOREIGN PATENT DOCUMENTS

| | | |
|---|---|---|
| JP | 2002215052 A | 7/2002 |
| JP | 2004193082 A | 7/2004 |
| JP | 2006003862 A | 1/2006 |
| JP | 2007017966 A | 1/2007 |
| JP | 2011022381 A | 2/2011 |
| JP | 2011253996 A | 12/2011 |

* cited by examiner

DISPLAY DEVICE

CROSS REFERENCE TO RELATED APPLICATIONS

This application is a U.S. National Phase Application under 35 U.S.C. 371 of International Application No. PCT/JP2014/002849 filed on May 29, 2014 and published in Japanese as WO 2014/196173 A1 on Dec. 11, 2014. This application is based on and claims the benefit of priority from Japanese Patent Application No. 2013-120820 filed on Jun. 7, 2013. The entire disclosures of all of the above applications are incorporated herein by reference.

TECHNICAL FIELD

The present disclosure relates to a display device.

BACKGROUND ART

A display device in a navigation device for a vehicle may include a liquid crystal display panel unit supported by a metal frame. This liquid crystal display panel unit includes various electronic components such as a driver IC and a connector substrate, and there is an issue that noise is produced from these electronic components. Accordingly, in this kind of display device, measures are taken to reduce influence of the noise. For example, in Patent Document 1, there is disclosed an art for preventing radiation noise by clamping a copper foil surface of a slide-type control board with a grounding metal fitting.

PRIOR ART DOCUMENT

Patent Document

Patent Document 1: JPH3-105997A

However, the art disclosed in Patent Document 1 requires the grounding metal fitting having a complex shape, and cannot be applied unless a noise generating source is a control board that can be slidably attached.

SUMMARY OF INVENTION

It is an objective of the present disclosure to provide a display device that takes improved measures to reduce influence of noise generated from a noise generating source.

To achieve the objective of the present disclosure, a display device in an aspect of the present disclosure includes a display panel unit having a noise generating source, and a metal frame to which the display panel unit is attached. The display panel unit is fixed to an attachment part which is provided at the frame. The display device includes a contact part that brings the display panel unit into contact with the frame, in addition to the attachment part. As for this kind of display device, the frame is fixed to a housing of the display device and is grounded. Accordingly, by adding the contact part where this frame and the display panel unit are in contact, the noise generated from the display panel unit flows easily through the frame via the contact part. As a result, the influence of the noise generated from the noise generating source can be reduced.

BRIEF DESCRIPTION OF DRAWINGS

The above and other objects, features and advantages of the present disclosure will become more apparent from the following detailed description made with reference to the accompanying drawings. In the drawings.

EMBODIMENT FOR CARRYING OUT INVENTION

Figure 1:
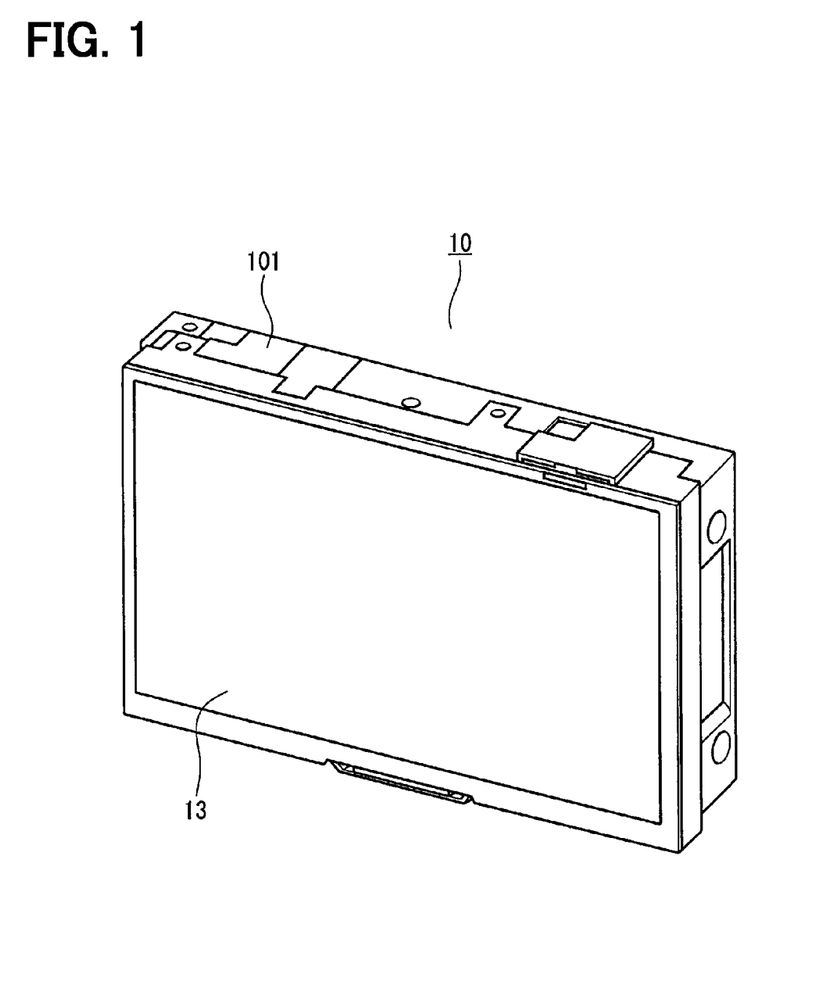
FIG. 1 is a perspective view illustrating an external appearance of a display device in accordance with an embodiment.
Figure 2:
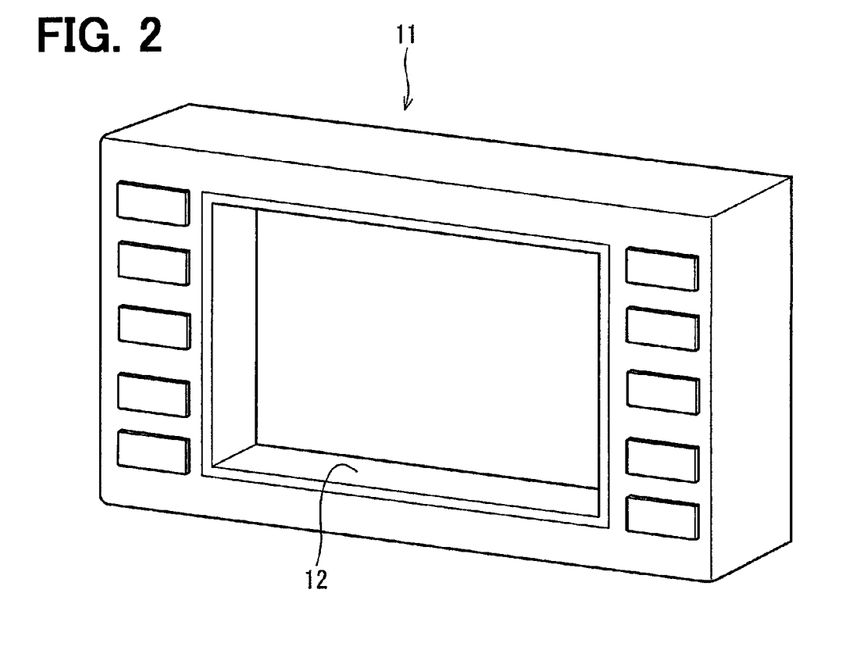
FIG. 2 is a perspective view illustrating an external appearance of an in-vehicle device main body according to the embodiment.
Figure 3:
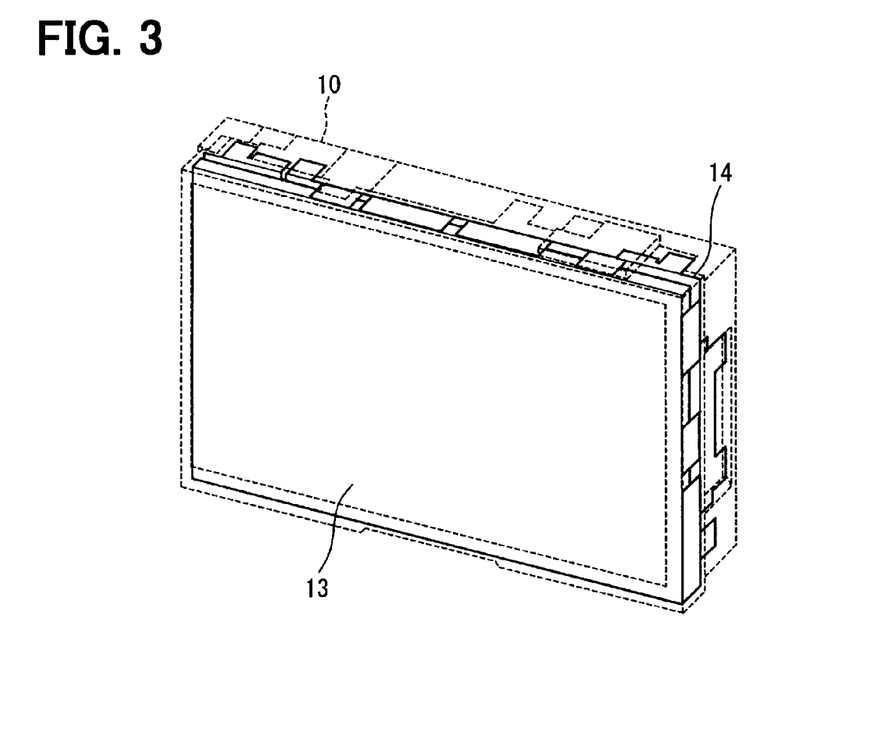
FIG. 3 is a perspective view illustrating a display panel unit and a frame that are incorporated in the display device of the embodiment.
Figure 4:
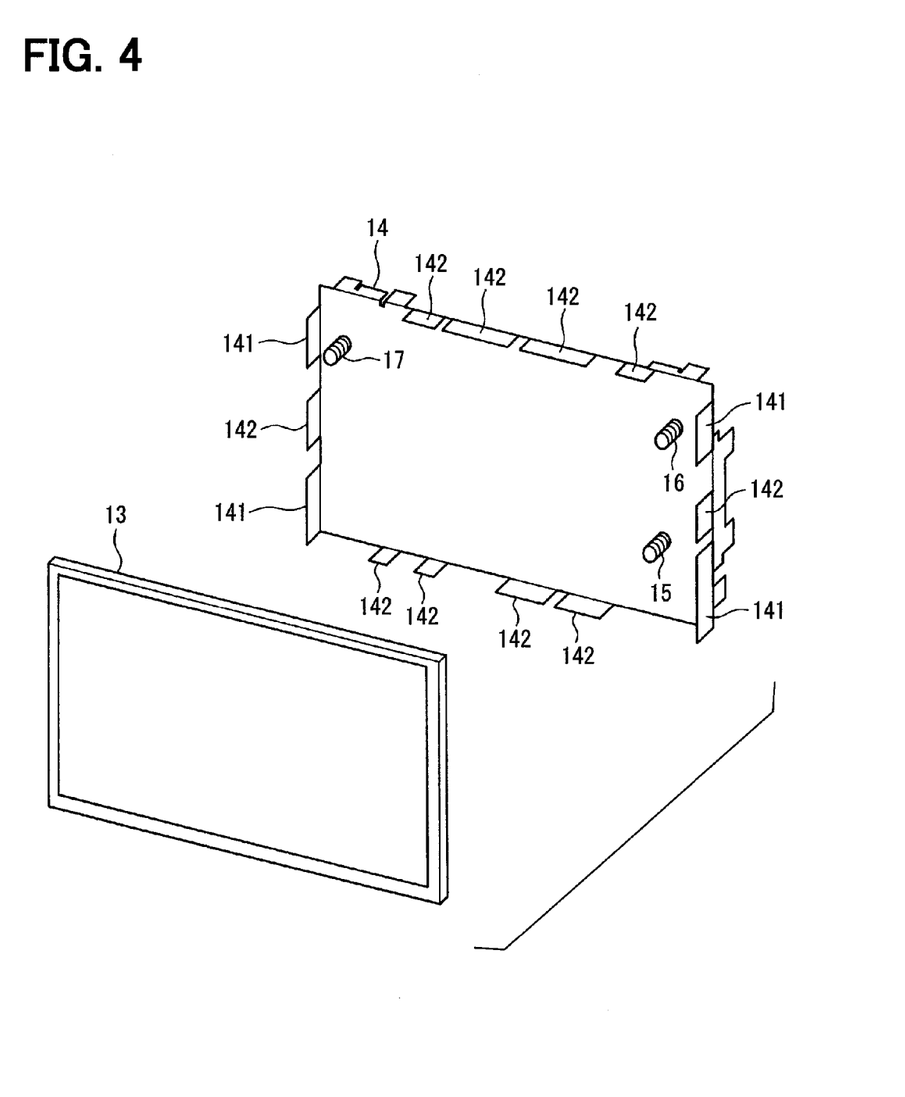
FIG. 4 is a perspective view illustrating the display device with its part broken down according to the embodiment.

An embodiment will be described below with reference to the drawings. A display device 10 illustrated in FIG. 1 is provided at, for example, a navigation device disposed in a vehicle, and is configured to be attached in an accommodating part 12 of a device main body 11 illustrated in FIG. 2. As illustrated in FIG. 3, a display panel unit 13 which is attached to a frame 14 is provided in the display device 10. As illustrated in FIG. 4, springs 15, 16, 17 are arranged between the display panel unit 13 and the frame 14.

Figure 5:
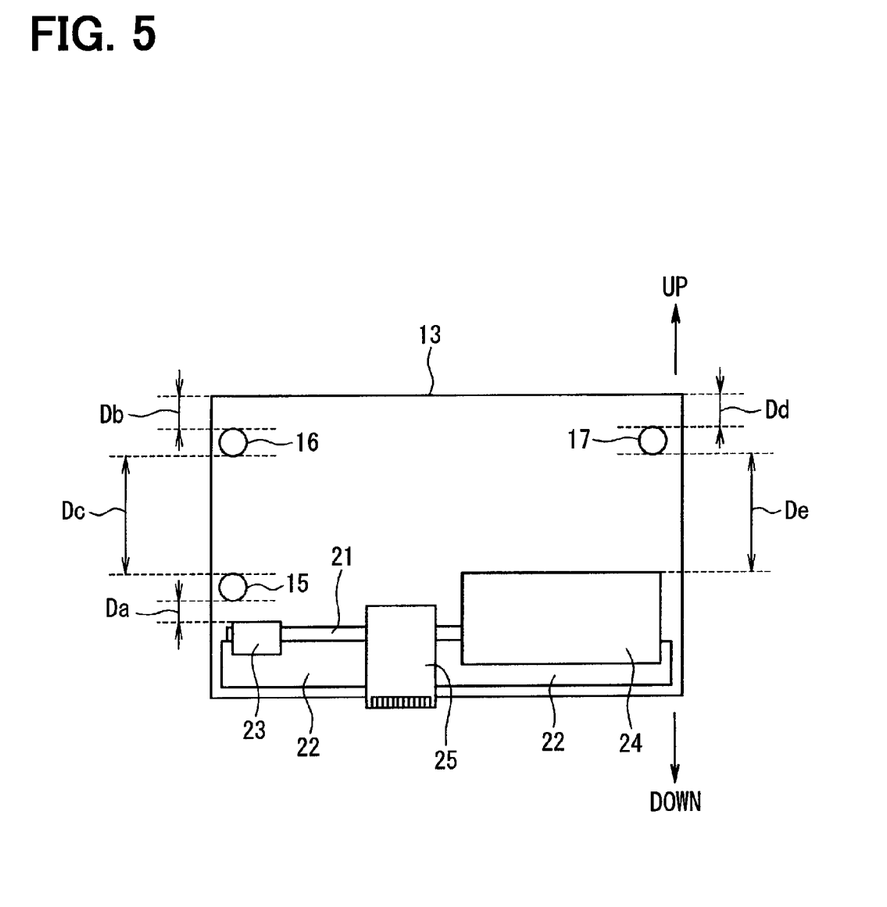
FIG. 5 is a rear view illustrating the display panel unit of the embodiment.

The display panel unit 13 is configured as a liquid-crystal display panel unit, and is configured by, although not shown in detail, filling up a space between two glass substrates with liquid crystal and disposing a backlight therebehind. In a state illustrated in FIGS. 1, 3 and 4, a front-side surface of the display panel unit 13 is a display surface on which various screens are displayed. As illustrated in FIG. 5, the display panel unit 13 includes a circuit board part 21 on a rear side which is a surface on its opposite side from the display surface. Various electronic components such as a driver IC and a connector substrate (not shown) which are noise generating sources are provided for this circuit board part 21. The circuit board part 21 is covered with a base copper foil 22 for shielding the noise generated from the circuit board part 21. In this case, a part of the circuit board part 21 is covered by the base copper foil 22. Additional copper foils 23, 24 covering the circuit board part 21 to be joined on to the base copper foil 22 are added to the base copper foil 22. The sizes, shapes, positions and so forth of these additional copper foils 23, 24 can be suitably modified based on, for example, positional relationships with the other components, or in order to produce a higher noise reduction effect.

A flexible print cable 25 (hereinafter referred to as an "FPC 25") is attached on the rear side of the display panel unit 13. This FPC 25 includes, for example, a multi-layered board that is configured by stacking printed circuit boards made of plastic film and that has flexibility, and a coating having electrical insulation properties is applied to the nearly entire FPC 25. This FPC 25 has many wiring patterns including a copper wire which functions as a signal line, and the FPC 25 is connected to the circuit board part 21 by soldering, for example. This FPC 25 can also serve as a noise generating source.

As illustrated in FIG. 4, the frame 14 is a metal member formed in a generally rectangular shape. Attachment pieces 141 are formed integrally with the end portions of this frame 14. In addition to the existing attachment pieces 141, attachment pieces 142 are further added to this frame 14. Each of these attachment pieces 142 is an example of a contact part, and is provided using, for example, a space located between the existing attachment pieces 141. The display panel unit 13 is fixed to the frame 14, for example, by being screwed or fitted to the existing attachment pieces 141 and the added attachment pieces 142. The attachment piece 142 is provided to be in contact with an appropriate position of an outer peripheral part of the display panel unit 13 based on, for example, positional relationships with the other components constituting the display device 10, or in order to produce a higher noise reduction effect. This attachment piece 142 may be provided integrally with the frame 14, or may be provided as an attachment part different from the frame 14.

In a state where the display panel unit 13 is supported by the frame 14, a clearance is formed between the display panel unit 13 and the frame 14, and in the present embodiment, the three springs 15, 16, 17 are clamped in this clearance. This frame 14 is fixed, with the frame 14 connected directly or indirectly to a metal housing 101 of the display device 10 illustrated in FIG. 1, and is thereby maintained at an grounding electric potential. Each of the springs 15, 16, 17 is an example of the contact part, and is configured from metal. These springs 15, 16, 17 are designed such that the sizes in the longitudinal direction, which is their expansion and contraction direction, are longer than the size between the display panel unit 13 and the frame 14 in a state before they are attached between the display panel unit 13 and the frame 14. Accordingly, these springs 15, 16, 17 are in a state compressed along their longitudinal direction in a state where the springs 15, 16, 17 are attached between the display panel unit 13 and the frame 14. As a result, in a state where the springs 15, 16, 17 are attached between the display panel unit 13 and the frame 14, the springs 15, 16, 17 are in a state closely-attached both to the rear side of the display panel unit 13 and to the front side of the frame 14 due to their urging force.

As illustrated in FIG. 5, the springs 15, 16, 17 are arranged at respectively different positions based on, for example, positional relationships with the other components constituting the display device 10, or in order to produce a higher noise reduction effect. The arrangement positions of the springs 15, 16, 17 of the present embodiment will be described below. In the following description, in a state where the display device 10 which incorporates the display panel unit 13 is attached to the device main body 11, a direction toward an upper side of the display panel unit 13 (see an arrow in FIG. 5) is "up" and a direction toward a lower side of the display panel unit 13 (see an arrow in FIG. 5) is "down".

In this case, the spring 15 is disposed near the additional copper foil 23 covering the circuit board part 21 at a position with a predetermined distance Da upward from the additional copper foil 23. The spring 16 is disposed at an upper part of the rear surface of the display panel unit 13 at a position with a predetermined distance Db downward from the upper side, which is an upper end portion of the display panel unit 13. This spring 16 is disposed at a position with a predetermined distance Dc upward from the spring 15. The spring 17 is disposed at the upper part of the rear surface of the display panel unit 13 at a position with a predetermined distance Dd downward from the upper side, which is an upper end portion of the display panel unit 13. This spring 17 is disposed near the additional copper foil 24 covering the circuit board part 21 at a position with a predetermined distance De upward from the additional copper foil 24. The predetermined distances Da to De which determine the arrangement positions of the springs 15, 16, 17 can be appropriately changed based on, for example, positional relationships with the other components, or in order to produce a higher noise reduction effect. The predetermined distance Db and the predetermined distance Dd may be set at the same distance. Specifically, the distance from the upper side of the display panel unit 13 to the spring 16 and the distance from the upper side of the display panel unit 13 to the spring 17 may be set at the same distance.

In the display device 10 having the above-described configuration, noise is produced from the circuit board part 21 and the FPC 25 having the noise generating sources. In this display device 10, the springs 15, 16, 17 are added between the display panel unit 13 and the frame 14 to reduce the influence of this noise. As a result of this configuration, the display panel unit 13 and the frame 14 are in contact with each other via the attachment pieces 141 and moreover, are in contact with each other also through the springs 15, 16, 17. Accordingly, the portion of contact between the display panel unit 13 which has a noise generating source and the frame 14 which is maintained at an grounding electric potential increases, so that the noise generated from the display panel unit 13 easily flows through the frame 14 via the existing contact parts and the added contact parts. Thus, the influence of the noise generated from the noise generating source can be reduced.

In the present embodiment, the springs 15, 16, 17 which are resilient members are employed. Accordingly, the springs 15, 16, 17 are in contact both with the display panel unit 13 and with the frame 14 in a closely-attached state, and the contact of the springs 15, 16, 17 with the display panel unit 13 and with the frame 14 is not insufficiently made. As a consequence, the noise generated from the display panel unit 13 can reliably flow through the frame 14 via the springs 15, 16, 17. Moreover, in the display device 10, the spring 15 is disposed at a position near the additional copper foil 23 with the predetermined distance Da from the additional copper foil 23 covering the circuit board part 21 which has the noise generating source. As a result of this configuration, the additional copper foil 23 serves as a flow passage for noise connecting together the circuit board part 21 and the spring 15. Therefore, the influence of the noise can be reduced more efficiently.

In addition, in the display device 10, the display panel unit 13 and the frame 14 are in contact with each other through the existing attachment pieces 141 and furthermore, are in contact with each other also via the added attachment pieces 142. Accordingly, the portion of contact between the display panel unit 13 and the frame 14 increases, and the noise generated from the display panel unit 13 easily flows through the frame 14 via the existing contact parts and the added contact parts. Thus, the influence of the noise generated from the noise generating source can be reduced.

Figure 6A:
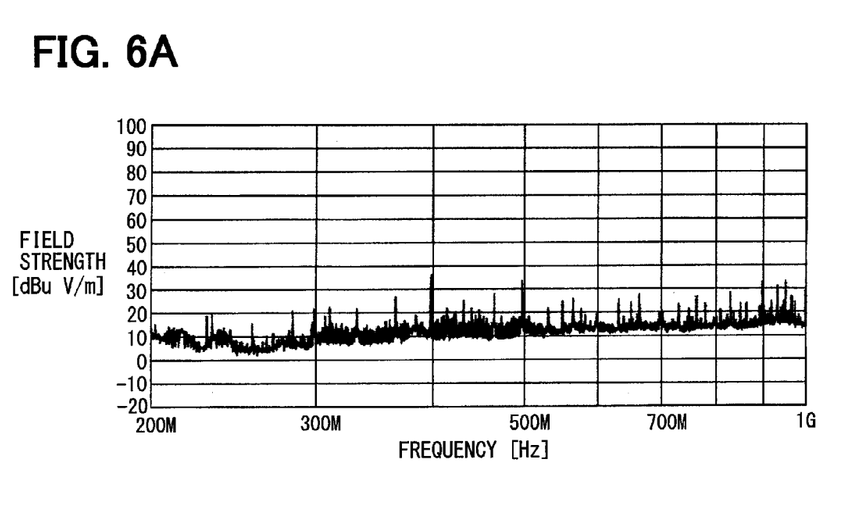
FIG. 6A is a diagram illustrating a result of comparative experiment relating to an effect of shielding noise and showing a measurement result for a conventional product in which a contact part is not added.
Figure 6B:
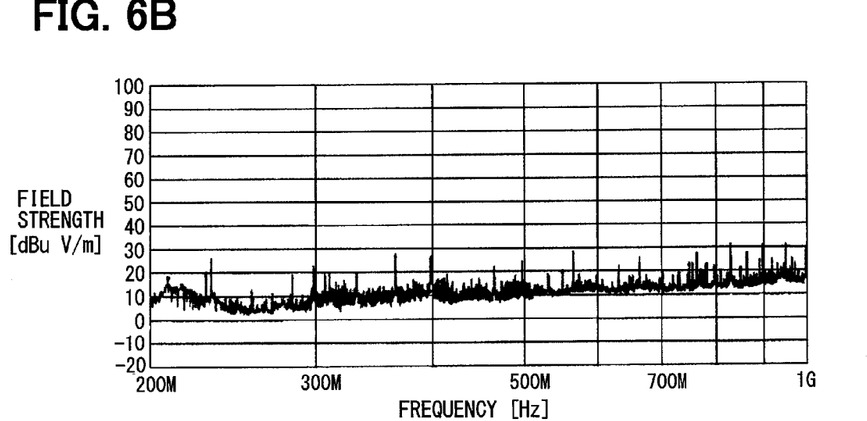
FIG. 6B is a diagram illustrating the result of comparative experiment relating to the effect of shielding the noise and showing a measurement result for the display device of the embodiment.

FIGS. 6A and 6B indicate the measurement results of electric field strength near the circuit board part 21 with the frequency of an input signal variously changed for the display device of the present embodiment and a conventional product to confirm the effect of the present embodiment. As evidenced by these measurement results, the display device of the present embodiment has the noise influence reduced compared to the conventional product, and can produce a remarkable noise reduction effect particularly in a band of 400 to 500 MHz. According to a verification result for the display device 10 of the present embodiment by the inventors and so forth, it is confirmed that in the display device 10 of the present embodiment, a horizontal component of noise is improved by approximately 4 to 13 dB compared with the conventional product and a vertical component of noise is improved by approximately 3 to 10 dB compared with the conventional product.

Figure 7:
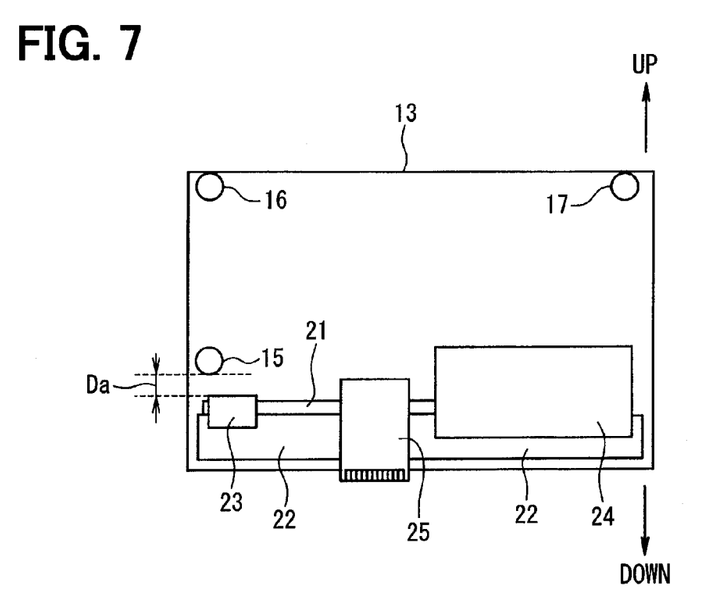
FIG. 7 is a diagram illustrating a comparative example, which corresponds to FIG. 5.

FIG. 7 illustrates a comparative example in which springs 16, 17 disposed at an upper part of a rear surface of a display panel unit 13 are arranged along an upper side of the display panel unit 13 instead of at a position with a predetermined distance downward from the upper side of the display panel unit 13. In this example, it is confirmed that a horizontal component of noise is improved by approximately 3 to 10 dB compared with the conventional product and a vertical component of noise is improved by approximately 3 to 7 dB compared with the conventional product. A noise reduction effect can also be produced by this exemplary configuration. However, in order to obtain an even higher noise reduction effect, as illustrated in FIG. 5, the springs 16, 17 disposed at the upper end part of the display panel unit 13 may be arranged at the positions with predetermined distances downward from the upper side of the display panel unit 13. This example illustrated in FIG. 7 is also an exemplary configuration included in the concept of the present disclosure.

Figure 8:
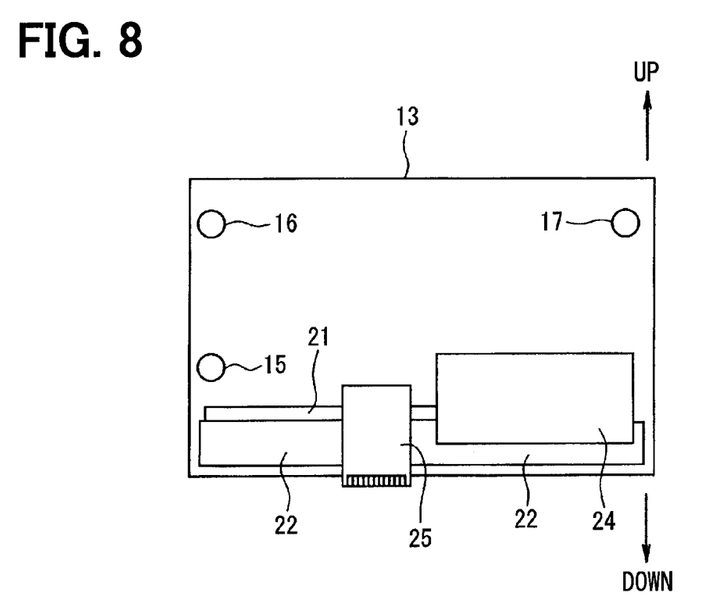
FIG. 8 is a diagram illustrating a comparative example, which corresponds to FIG. 5.

FIG. 8 illustrates a comparative example in which the additional copper foil 23 is removed from the configuration of the present embodiment illustrated in FIG. 5. In this example, it is confirmed that a relatively low band of a horizontal component of noise is improved by approximately 4 to 7 dB compared with the conventional product, but a relatively high band of the horizontal component of noise is deteriorated by approximately 5 to 10 dB compared with the conventional product. Additionally, it is confirmed that a vertical component of noise is deteriorated by approximately 3 to 4 dB compared with the conventional product. Therefore, in order to obtain an even higher noise reduction effect, the additional copper foil may be provided as illustrated in FIG. 5. This example illustrated in FIG. 8 is also an exemplary configuration included in the concept of the present disclosure.

The present disclosure is not limited to the above-described embodiment, and can be applied to various embodiments without departing from the scope of the disclosure. For example, the display panel unit 13 is not limited to the liquid-crystal display panel unit. The display panel unit 13 may be configured by, for example, an electro luminescence (EL) panel, or a field emission display (FED) panel. The shape and size of the spring, the number of added springs, the position of the added spring, and so forth can be suitably modified. The shape and size of the attachment piece, the number of added attachment pieces, the position of the added attachment piece, and so forth can be suitably modified. The attachment piece may be added continuously at the entire circumference or part of the outer peripheral part of the frame 14. In addition, as the measures to reduce the noise, such a configuration as to add only the spring may be employed, or such a configuration as to add only the attachment piece may be employed. According to the verification result by the inventors and so forth, it is confirmed that a horizontal component of noise is also improved by approximately 3 to 6 dB compared with the conventional product in such a configuration as to add only the attachment piece as the measures to reduce the noise.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A display device comprising:
a display panel unit including a noise generating source;
a metal frame to which the display panel unit is attached, wherein:
the display panel unit is fixed to an attachment part which is provided at the frame; and
the frame includes a contact part that brings the display panel unit into contact with the frame, in addition to the attachment part, and
a spring between the display panel unit and the frame as the contact part, wherein
the display panel unit includes a copper foil covering a portion of the noise generating source, which is less than an entire portion of the noise generating source,
the spring is disposed at a position located a predetermined distance from the copper foil,
the display device is attached to a device main body, and
the spring is disposed at a position located a predetermined distance from an upper side, which is an upper end portion of the display panel unit, with the display panel unit attached to the device main body.

2. The display device according to claim 1, wherein the spring is one of a plurality of springs.

3. The display device according to claim 2, wherein the plurality of springs include a pair of upper springs, each of the pair of upper springs is disposed at a position located a predetermined distance from an upper end portion of the display panel unit.

4. The display device according to claim 3, wherein the predetermined distance for each of the pair of upper springs is the same.

5. The display device according to claim 1, wherein the copper foil is one of a plurality of copper foils.

6. The display device according to claim 1, wherein the spring is in direct contact with both the display panel and the frame.

7. The display device according to claim 6, wherein the spring is in a compressed state when in direct contact with both the display panel and the frame.

* * * * *